United States Patent
Noguchi

(12) 
(10) Patent No.: US 6,413,681 B1
(45) Date of Patent: Jul. 2, 2002

(54) DIAMOND FILM FOR X-RAY LITHOGRAPHY AND MAKING METHOD

(75) Inventor: Hitoshi Noguchi, Annaka (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 09/448,295

(22) Filed: Nov. 24, 1999

Related U.S. Application Data

(63) Continuation-in-part of application No. 09/081,770, filed on May 21, 1998, now abandoned.

(30) Foreign Application Priority Data

| May 21, 1997 | (JP) | 9-147120 |
| Aug. 1, 1997 | (JP) | 9-220837 |
| May 21, 1998 | (EP) | 98304053 |

(51) Int. Cl.⁷ ............. G03F 9/00; C23C 16/26; G21K 5/00
(52) U.S. Cl. ............. 430/5; 378/35; 427/249.8
(58) Field of Search ............. 430/5; 378/35; 264/317; 427/249.8, 569, 575, 577, 585, 587; 117/88, 103

(56) References Cited

U.S. PATENT DOCUMENTS

| 5,146,481 A | 9/1992 | Garg et al. | 378/35 |
| 5,334,342 A | 8/1994 | Harker et al. | 264/317 |
| 5,405,645 A | 4/1995 | Sevillano et al. | 427/10 |
| 5,479,875 A * | 1/1996 | Tachibana et al. | 117/103 |
| 5,798,143 A * | 8/1998 | Partridge | 427/249 |
| 5,814,149 A * | 9/1998 | Shintani et al. | 117/104 |
| 5,964,942 A * | 10/1999 | Tanabe et al. | 117/87 |
| 6,274,403 B1 * | 8/2001 | Klages et al. | 438/105 |

FOREIGN PATENT DOCUMENTS

EP 762466 A1 3/1997

OTHER PUBLICATIONS

Gomez–Aleixandre et al., Thin Solid Films, 303, pp. 34–38 (1997).

Schafer et al., Diamond and Related Materials, 2, pp. 1191–1196 (1993).

Ravet et al., Application of Diamond Thin Films To X–Ray Lithograph Masks Proceedings of the international Colloquium on Plasma Processes, Antibes, Juan Les Pins, Jun. 6–11, 1993, No. Colloque 9, XP000399252, Societe Francaise du Vide, pp. 237–239 (1993).

* cited by examiner

*Primary Examiner*—S. Rosasco
(74) *Attorney, Agent, or Firm*—Birch, Stewart, Kolasch & Birch, LLP

(57) ABSTRACT

A diamond film is formed on a silicon single crystal substrate by a microwave plasma CVD or hot filament CVD process using a source gas. The source gas consists essentially of 3.0% to 8.0% by volume of $CH_4$, 87.0% to less than 97.0% by volume of $H_2$, and more than 0.0% to 5.0% by volume of $O_2$. A diamond film having a sufficient crystallinity to serve as a membrane for x-ray lithography and a precisely controlled tensile stress can be formed.

10 Claims, 1 Drawing Sheet

DIAMOND FILM FOR X-RAY LITHOGRAPHY AND MAKING METHOD

CROSS REFERENCE TO RELATED APPLICATION

This application is a continuation-in-part of now abandoned application Ser. No. 09/081,770 filed on May 21, 1998, the entire contents of which are hereby incorporated by reference.

This invention relates to a diamond film for x-ray lithography and a method for preparing the same.

BACKGROUND OF THE INVENTION

As the manufacture of advanced semiconductor devices requires finer patterning, x-ray lithography is considered to have a promising future.

A mask used in x-ray lithography has a structure as shown in FIG. 1. The mask includes a support substrate 1, a x-ray transmissive membrane 2 disposed on one surface of the substrate 1, an x-ray absorbing pattern 3 carried on the membrane 2, and a surface protective film 4 disposed on another surface of the substrate 1. The membrane 2 must have the properties of (1) high mechanical strength, (2) resistance to irradiation of high-energy beams such as high-energy electron beams and synchrotron orbital radiation (SOR), and (3) high transmittance to visible light as needed for high precision filaments.

Heretofore, BN, boron dope, Si, SiN, SiC, diamond, etc. have been proposed as the mask membrane material for x-ray lithography. Among these, diamond satisfying the above-mentioned properties (1) to (3) is regarded optimum as the mask membrane material for x-ray lithography.

The membrane must be a self-supporting film of 2 to 3 $\mu$m thick in order to minimize the absorption of x-rays. In order for the membrane to be self-supporting, the film must have a tensile stress in the range of 0.0 to $4.0 \times 10^9$ dyn/cm$^2$.

In general, diamond films are prepared by microwave plasma chemical vapor deposition (CVD) and hot filament CVD processes because these processes are relatively easy to form diamond films of good crystallinity over large areas. For example, the diamond film preparation method which is most commonly employed in the prior art relies on the microwave plasma CVD process using hydrogen-diluted methane as a source gas. If deposition is carried out at a low methane concentration, a diamond film of good crystallinity is obtained, but the film is always compressive stressed. Despite good crystallinity, the film cannot be self-supporting. Such a film cannot be utilized as the x-ray mask. Conversely, if deposition is carried out at a high methane concentration, a diamond film having tensile stresses produced therein is obtained at the sacrifice of crystallinity. Since the microwave plasma CVD and hot filament CVD processes utilize plasma, many film deposition parameters are correlated to plasma conditions. It is, therefore, quite difficult to form a diamond film capable of satisfying both crystallinity and film stress which are essential physical properties for diamond films to serve as the x-ray mask.

SUMMARY OF THE INVENTION

An object of the invention is to provide a method for preparing a diamond film while the stress produced during deposition is precisely controlled so as to form a tensile stressed diamond film without reducing the crystallinity thereof whereby the diamond film can serve as a membrane for x-ray lithography.

Another object of the invention is to provide a high crystallinity diamond film having tensile stresses.

A diamond film is formed on a silicon single crystal substrate by a microwave plasma CVD or hot filament CVD process using hydrogen-diluted methane as a source gas. We have found that when a gaseous mixture of methane (CH$_4$) gas, hydrogen (H$_2$) gas and oxygen (O$_2$) gas is used as the source gas, and the proportions (% by volume) of the respective gases are set to fall in the ranges:

$3.0\% \leq CH_4 \leq 8.0\%$, $87.0\% \leq H_2 < 97.0\%$, and $0.0\% < O_2 \leq 5.0\%$, there is deposited a highly crystalline diamond film exerting a tensile stress, especially a tensile stress of $4.0 \times 10^9$ dyn/cm$^2$ or smaller. This diamond film is effective as a membrane for x-ray lithography. When film deposition is carried out while keeping the silicon single crystal substrate at a temperature of 900° C. to 1,000° C., the tensile stress can be controlled. In summary, we have found that when diamond is deposited by the microwave plasma CVD or hot filament CVD process under controlled conditions including (1) the volume proportions of methane (CH$_4$), hydrogen (H$_2$) and oxygen (O$_2$) of the source gas and (2) the substrate temperature, a diamond film whose internal stress is controlled at a high precision can be produced without detracting from the crystallinity thereof.

We have further found the following. The diamond film has a hydrogen concentration [H] and an oxygen concentration [O] at a depth of 0.5 $\mu$m from its surface as measured by secondary ion mass spectroscopy (SIMS). The film is more effective when the hydrogen and oxygen concentrations [H] and [O] fall in the ranges: $5.0 \times 10^{19}$ atoms/cm$^3 \leq$ [H]$\leq 5.0 \times 10^{21}$ atoms/cm$^3$ and $2.0 \times 10^{18}$ atoms/cm$^3 \leq$[O]$\leq 5.0 \times 10^{20}$ atoms/cm$^3$. The diamond film exhibits a peak attributable to diamond near 1333 cm$^{-1}$ and a peak attributable to amorphous carbon at 1530 cm$^{-1}$ as analyzed by laser Raman spectroscopy using a laser beam having a wavelength of 532 nm and a diameter of 150 $\mu$m. The film is more effective when the ratio of the intensity of the former peak to the intensity of the latter peak, I(1333 cm$^{-1}$)/I(1530 cm$^{-1}$), is in the range: $1.20 \leq$ I(1333 cm$^{-1}$)/I(1530 cm$^{-1}$) $\leq 1.50$. The diamond film exhibits a peak attributable to (111) oriented diamond at a diffraction angle (2θ) of 43.9° and a peak attributable to (220) oriented diamond at a diffraction angle (2θ) of 75.3° as analyzed by x-ray diffractometry at a wavelength λ of 1.54 Å. The film is more effective when the ratio of the intensity of the former peak to the intensity of the latter peak, I(111)/I(220), is in the range: $3.0 \leq$ I(111)/I(220) $\leq 8.5$.

In a first aspect, the invention provides a method for preparing a diamond film for x-ray lithography, comprising the step of depositing diamond on a silicon single crystal substrate by a microwave plasma CVD or hot filament CVD process using hydrogen-diluted methane as a source gas, characterized in that oxygen gas is added to the source gas so that the resulting source gas consists essentially of 3.0% to 8.0% by volume of methane gas, 87.0% to less than 97.0% by volume of hydrogen gas, and more than 0.0% to 5.0% by volume of oxygen gas. Preferably, the silicon single crystal substrate is heated at a temperature of 900 to 1,000° C. while diamond is deposited thereon.

In a second aspect, the invention provides a diamond film for x-ray lithography prepared by the above method and having a tensile stress of $4.0 \times 10^9$ dyn/cm$^2$ or smaller.

The invention also provides a diamond film for x-ray lithography prepared by the above method and having a hydrogen concentration [H] and an oxygen concentration [O] at a depth of 0.5 μm from its surface as measured by SIMS which fall in the ranges:

5.0×10$^{19}$ atoms/cm$^3$≦[H]≦5.0×10$^{21}$ atoms/cm$^3$ and
2.0×10$^{18}$ atoms/cm$^3$≦[O]≦5.0×10$^{20}$ atoms/cm$^3$.

The invention further provides a diamond film for x-ray lithography prepared by the above method wherein when analyzed by laser Raman spectroscopy using a laser beam having a wavelength of 532 nm and a diameter of 150 μm, the diamond film exhibits a peak attributable to diamond near 1333 cm$^{-1}$ and a peak attributable to amorphous carbon at a Raman shift of 1530 cm$^{-1}$, and the ratio of the intensity of the former peak to the intensity of the latter peak, I(1333 cm$^{-1}$)/I(1530 cm$^{-1}$), is in the range: 1.20≦I(1333 cm$^{-1}$)/I(1530 cm$^{-1}$)≦1.50.

Still further, the invention provides a diamond film for x-ray lithography prepared by the above method wherein when analyzed by x-ray diffractometry at a wavelength λ of 1.54 Å, the diamond film exhibits a peak attributable to (111) oriented diamond at a diffraction angle (2θ) of 43.9° and a peak attributable to (220) oriented diamond at a diffraction angle (2θ) of 75.3°, and the ratio of the intensity of the former peak to the intensity of the latter peak, I(111)/I(220), is in the range: 3.0≦I(111)/I(220)≦8.5.

BRIEF DESCRIPTION OF THE DRAWING

The only figure.

DETAILED DESCRIPTION OF THE INVENTION

Figure 1:
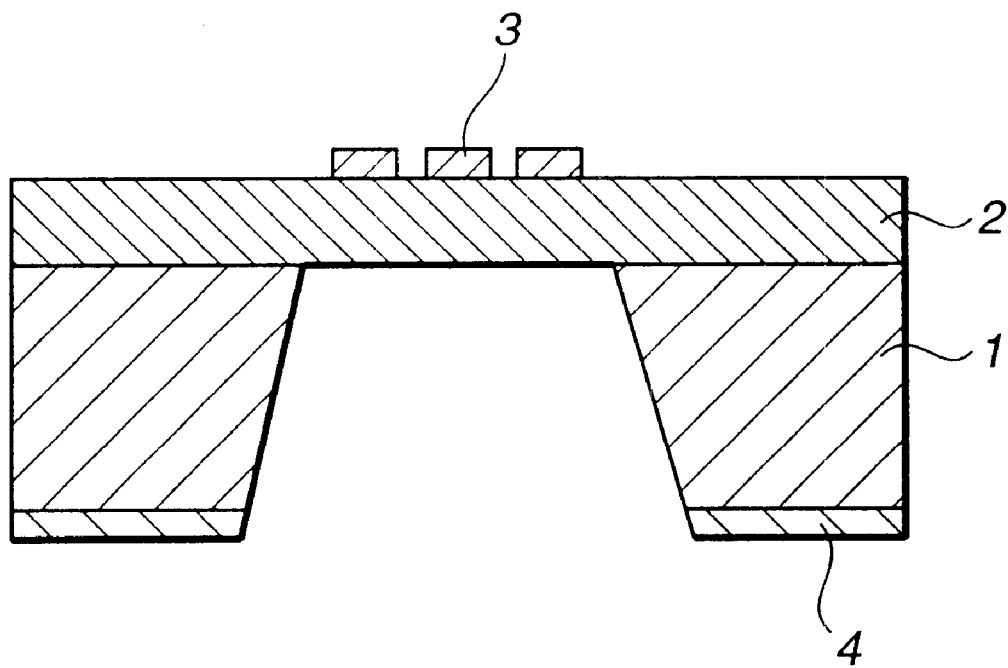
FIG. 1 is a cross-sectional view of a x-ray mask to which the diamond film of the invention is applicable.

According to the invention, a diamond film for x-ray lithography is formed on a silicon single crystal substrate by a microwave plasma chemical vapor deposition (CVD) process or a hot filament CVD process. A gaseous mixture of methane (CH$_4$) gas and hydrogen (H$_2$) gas is conventionally used as a source gas. According to the invention, oxygen (O$_2$) gas is added to the source gas. The resulting source gas is a mixture consisting essentially of, in % by volume, 3.0% to 8.0% of methane gas, 87.0% to less than 97.0% of hydrogen gas, and more than 0.0% to 5.0% of oxygen gas, and preferably 3.0% to 7.5% of methane gas, 88.5% to less than 97.0% of hydrogen gas, and more than 0.0% to 4.0% of oxygen gas. Preferably, the lower limit of the methane gas content is 3.5% by volume, more preferably 4.0% by volume, and the lower limit of the oxygen gas content is 0.1% by volume, more preferably 0.5% by volume. The upper limit of the hydrogen gas content is preferably 96.4% by volume, more preferably 96.0% by volume, most preferably 95.5% by volume. If the proportions of the respective gases are outside the specific ranges, either one or both of crystallinity and stress of the resulting diamond film are below the requisite level for the diamond film to serve as the x-ray mask.

Except that the gas mixture of the above composition is used as the source gas, a diamond film is formed on a silicon single crystal substrate according to a well-known diamond film forming method relying on the microwave plasma CVD or hot filament CVD process. If it is desired to induce a more tensile stress in the film, the silicon single crystal substrate is heated at a temperature in the range of 900° C. to 1,000° C. using a sintered or CVD silicon carbide heating element, for example. The heating of the substrate allows for fine adjustment of the stress in the film deposited thereon. High temperatures above 1,000° C. can detract from the crystallinity of diamond.

The diamond film is usually deposited to a thickness of about 1 to 3 μm, especially about 2 μm. The tensile stress produced in the diamond film is preferably in the range of 4.0×10$^9$ dyn/cm$^2$ or smaller, especially 3.0×10$^9$ dyn/cm$^2$ or smaller.

With respect to impurities, the diamond film has a hydrogen concentration [H] and an oxygen concentration [O] in the film at a depth of 0.5 μm from its surface as measured by secondary ion mass spectroscopy (SIMS). The film becomes favorable when the hydrogen concentration [H] falls in the range:

5.0×10$^{19}$ atoms/cm$^3$≦[H]≦5.0×10$^{21}$ atoms/cm$^3$, and more preferably
5.0×10$^{19}$ atoms/cm$^3$≦[H]≦9.0×10$^{20}$ atoms/cm$^3$, and the oxygen concentration [O] falls in the range:
2.0×10$^{18}$ atoms/cm$^3$≦[O]≦5.0×10$^{20}$ atoms/cm$^3$, and more preferably
2.0×10$^{18}$ atoms/cm$^3$≦[O]≦4.0×10$^{20}$ atoms/cm$^3$.

With respect to crystallinity, when the diamond film is analyzed by laser Raman spectroscopy using a laser beam having a wavelength of 532 nm and a diameter of 150 μm, it exhibits a peak attributable to diamond near 1333 cm$^{-1}$ having an intensity I(1333 cm$^{-1}$) and a peak attributable to amorphous carbon at a Raman shift of 1530 cm$^{-1}$ having an intensity I(1530 cm$^{-1}$). Better results are obtained when the peak intensity ratio, I(1333 cm$^{-1}$)/I(1530 cm$^{-1}$), is in the range:

1.20≦I(1333 cm$^{-1}$)/I(1530 cm$^{-1}$)≦1.50, and more preferably
1.25≦I(1333 cm$^{-1}$)/I(1530 cm$^{-1}$)≦1.50.

Also with respect to crystallinity, when the diamond film is analyzed by x-ray diffractometry at a wavelength λ of 1.54 Å, it exhibits a peak attributable to (111) oriented diamond at a diffraction angle (2θ) of 43.9° having an intensity I(111) and a peak attributable to (220) oriented diamond at a diffraction angle (2θ) of 75.3° having an intensity I(220). Better results are obtained when the peak intensity ratio, I(111)/I(220), is in the range:

3.0≦I(111)/I(220)≦8.5, and more preferably
4.0≦I(111)/I(220)≦8.5.

According to the invention, a diamond film having a sufficient crystallinity to serve as a membrane for x-ray lithography and a precisely controlled tensile stress can be formed using the microwave plasma CVD or hot filament CVD process. This diamond film provides an x-ray mask with a high precision and a longer lifetime.

EXAMPLE

Examples of the invention are given below by way of illustration and not by way of limitation.

Example 1

A both side polished silicon single crystal (100) wafer having a diameter of 3 inches and a thickness of 2,000 μm was used as the substrate. Prior to film deposition, the substrate on the surface was pretreated in a fluidized bed of diamond grits for the purpose of increasing the density of diamond nuclei. After the pretreatment, the substrate was mounted in a microwave plasma CVD chamber, which was evacuated to a base pressure of 10$^{-3}$ Torr or lower by means of a rotary pump. Source gases, methane (CH$_4$), hydrogen ($H_2$), and oxygen ($O_2$) were introduced into the chamber at a rate of 45.0 sccm, 945.0 sccm, and 10.0 sccm, respectively. The volume ratio of the source gases was methane/hydrogen/oxygen=4.5/94.5/1.0% by volume. After the chamber was set at 30 Torr by adjusting the opening of a valve in the vacuum pump system, microwaves with a power of 3,000 W were applied to create a plasma to deposit diamond for 37 hours. During film deposition, the substrate was heated solely with microwaves. On measurement by a pyrometer, the substrate surface was at 850° C.

There was deposited a diamond film of 3 μm thick. The film had a tensile stress of $0.2 \times 10^9$ dyn/cm$^2$ as calculated from the measurement of warpage of the substrate.

For quantitative determination of crystallinity, the diamond film was analyzed by x-ray diffractometry and laser spectroscopy. On analysis by an x-ray diffractometer RINT-1000 (Rigaku K. K.) at a wavelength λ of 1.54 Å, the ratio of the intensity of a peak attributable to (111) oriented diamond at a diffraction angle (2θ) of 43.9° to the intensity of a peak attributable to (220) oriented diamond at a diffraction angle (2θ) of 75.3° was I(111)/I(220)=6.2.

On analysis by a laser Raman spectrometer Holo Probe 532 (Kaiser Optical Systems) using a laser beam having a wavelength of 532 nm and a diameter of 150 μm, the ratio of the intensity of a peak attributable to diamond at 1333 cm$^{-1}$ to the intensity of a peak attributable to amorphous carbon at a Raman shift of 1530 cm$^{-1}$ was I(1333 cm$^{-1}$)/I(1530 cm$^{-1}$)=1.40.

Impurities in the film, hydrogen and oxygen, were measured by a secondary ion mass spectrometer (SIMS) (ims-4f by Cameca). The primary ion used was Cs$^+$ ion at 14.5 eV. The hydrogen concentration [H] and oxygen concentration [O] at a depth of 0.5 μm from the outer surface of the diamond film were

[H]=$1.4 \times 10^{20}$ atoms/cm$^3$ and
[O]=$1.4 \times 10^{19}$ atoms/cm$^3$.

Finally, the silicon substrate was etched from the back surface over a central square area of 26×26 mm with an aqueous solution of KOH at 95° C., completing a membrane. The thus finished membrane was examined for resistance to SOR irradiation. First, SOR light having a center wavelength of 7 Å was locally irradiated to a rectangular area of 7×15 mm in a helium atmosphere of 1 atm. whereupon the in-plane distortion (IPD) of the membrane was measured by Nikon 3i meter (Nikon K.K.). The results showed that when SOR light was irradiated up to a dose of 100 kJ/cm$^2$, the maximum IPD was 15 nm, that is, within the reproducible measurement precision of the meter. The transmittance of light at a wavelength of 633 nm remained unchanged before and after the SOR irradiation.

Example 2

For the purpose of producing a film with a higher tensile stress than in Example 1, film deposition was carried out under the same conditions as in Example 1 by setting the substrate temperature at 970° C. Operation for 30 hours deposited a diamond film of 3 μm thick. The film had a tensile stress of $2.3 \times 10^9$ dyn/cm$^2$.

Analysis by x-ray diffractometry and laser Raman spectroscopy gave the following results.

I(111)/I(220)=5.5

I(1333 cm$^{-1}$)/I(1530 cm$^{-1}$)=1.32 The hydrogen and oxygen concentrations [H] and [O] at a depth of 0.5 μm from the outer surface of the diamond film were

[H]=$1.5 \times 10^{20}$ atoms/cm$^3$ and
[O]=$2.0 \times 10^{19}$ atoms/cm$^3$.

Finally, the silicon substrate was etched from the back surface over a central square area of 26×26 mm with an aqueous solution of KOH at 95° C., completing a membrane. The thus finished membrane was examined for resistance to SOR irradiation. After irradiation under the same conditions as in Example 1, the maximum IPD was 16 nm, that is, within the reproducible measurement precision of the meter. The transmittance of light at a wavelength of 633 nm remained unchanged before and after the SOR irradiation.

Comparative Examples

Using source gases as shown in Table 1, diamond films of 3 μm thick were formed by a microwave plasma CVD process under conditions as shown in Table 1. The stress and crystallinity of the films and the results of membranes fabricated therefrom are also shown in Table 1.

TABLE 1

| Microwave power (W) | Source gas $CH_4/H_2/O_2$ (vol %) | Pressure (Torr) | Substrate temperature (° C.) | Stress (dyn/cm$^2$) | Crystallinity | XRD intensity ratio, I(111)/I(220) | Raman intensity ratio, I(1333 cm$^{-1}$)/I(1530 cm$^{-2}$) | Impurity concentration (atoms/cm$^3$) | Membrane formation | SOR resistance Maximum IPD | Visible light transmission change |
|---|---|---|---|---|---|---|---|---|---|---|---|
| 2000 | 0.5/99.5/0.0 | 30 | 850 | $-2.1 \times 10^9$ compressive | good | 6.0 | 1.32 | [H] $1.7 \times 10^{20}$ [O] $2.5 \times 10^{19}$ | N.G. | | membrane not formed with no measurement |
| 3000 | 0.5/99.5/0.0 | 30 | 850 | $-2.3 \times 10^9$ compressive | good | 6.4 | 1.35 | [H] $1.5 \times 10^{20}$ [O] $2.1 \times 10^{19}$ | N.G. | | |
| 3000 | 0.5/99.4/0.1 | 30 | 850 | $-2.6 \times 10^9$ compressive | good | 7.0 | 1.40 | [H] $1.3 \times 10^{20}$ [O] $2.0 \times 10^{19}$ | N.G. | | |
| 3000 | 2.0/98.0/0.0 | 30 | 850 | $3.5 \times 10^8$ tensile | poor | 0.5 | 1.17 | [H] $8.5 \times 10^{21}$ [O] $3.0 \times 10^{19}$ | O.K. | 90 nm | lowered |
| 3000 | 5.0/95.0/0.0 | 30 | 850 | $3.0 \times 10^8$ tensile | poor | 0.2 | 1.13 | [H] $2.1 \times 10^{22}$ [O] $3.0 \times 10^{19}$ | O.K. | 185 nm | lowered |

It is evident from Table 1 that when source gas mixtures outside the scope of the invention are used, no diamond films satisfy the stress and crystallinity requirements at the same time.

Japanese Patent Application No. 220837/1997 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

What is claimed is:

1. A method for preparing a diamond film for x-ray lithography, comprising the step of pretreating a silicon single crystal substrate in a fluidized bed of diamond grits and depositing diamond directly on said silicon single crystal substrate by a microwave plasma CVD or hot filament CVD process using hydrogen-diluted methane as a source gas, oxygen gas being added to the source gas so that the resulting source gas consists essentially of 3.0% to 8.0% by volume of methane gas, 87.0% to less than 97.0% by volume of hydrogen gas, and more than 0.0% to 5.0% by volume of oxygen gas.

2. The method of claim 1 wherein the silicon single crystal substrate is heated at a temperature of 900 to 1,000° C. while diamond is deposited thereon.

3. A diamond film for x-ray lithography prepared by the method of claim 1 or 2 and having a tensile stress of $4.0 \times 10^9$ dyn/cm$^2$ or smaller.

4. A diamond film for x-ray lithography prepared by the method of claim 1 or 2 and having a hydrogen concentration [H] and an oxygen concentration [O] at a depth of 0.5 µm from its surface as measured by SIMS which fall in the ranges:

$5.0 \times 10^{19}$ atoms/cm$^3 \leq$ [H] $\leq 5.0 \times 10^{21}$ atoms/cm$^3$ and $2.0 \times 10^{18}$ atoms/cm$^3 \leq$ [O] $\leq 5.0 \times 10^{20}$ atoms/cm$^3$.

5. A diamond film for x-ray lithography prepared by the method of claim 1 or 2 wherein when analyzed by laser Raman spectroscopy using a laser beam having a wavelength of 532 nm and a diameter of 150 µm, the diamond film exhibits a peak attributable to diamond near 1333 cm$^{-1}$ and a peak attributable to amorphous carbon at a Raman shift of 1530 cm$^{-1}$, and the ratio of the intensity of the former peak to the intensity of the latter peak, I(1333 cm$^{-1}$)/I(1530 cm$^{-1}$), is in the range: $1.20 \leq$ I(1333 cm$^{-1}$)/I (1530 cm$^{-1}$) $\leq 1.50$.

6. A diamond film for x-ray lithography prepared by the method of claim 1 or 2 wherein when analyzed by x-ray diffractometry at a wavelength λ of 1.54 Å, the diamond film exhibits a peak attributable to (111) oriented diamond at a diffraction angle (2θ) of 43.9° and a peak attributable to (220) oriented diamond at a diffraction angle (2θ) of 75.3°, and the ratio of the intensity of the former peak to the intensity of the latter peak, I(111)/I(220), is in the range: $3.0 \leq$ I(111)/I(220) $\leq 8.5$.

7. The method of claim 1, wherein the resulting source gas contains 3.5% to 7.5% by volume of methane gas.

8. The method of claim 1, wherein the resulting source gas contains 0.1% to 5.0% by volume of oxygen gas.

9. The method of claim 7, wherein the resulting source gas contains 0.1% to 5.0% by volume of oxygen gas.

10. The method of claim 1, wherein the resulting source gas contains 0.5% to 5.0% by volume of oxygen gas.

* * * * *